(12) United States Patent
Shen et al.

(10) Patent No.: US 11,869,850 B2
(45) Date of Patent: Jan. 9, 2024

(54) PACKAGE STRUCTURE COMPRISING CONDUCTIVE METAL BOARD AND GROUND ELEMENT

(71) Applicant: WISTRON NEWEB CORPORATION, Hsinchu (TW)

(72) Inventors: Lee-Cheng Shen, Hsinchu (TW); Chao-Hsuan Wang, Hsinchu (TW); Po-Sheng Huang, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 0 days.

(21) Appl. No.: 18/046,224

(22) Filed: Oct. 13, 2022

(65) Prior Publication Data

US 2023/0053850 A1 Feb. 23, 2023

Related U.S. Application Data

(62) Division of application No. 17/015,140, filed on Sep. 9, 2020, now abandoned.

(30) Foreign Application Priority Data

Jun. 19, 2020 (TW) ................................. 109120718

(51) Int. Cl.
*H01L 23/552* (2006.01)
*H01L 21/56* (2006.01)
(Continued)

(52) U.S. Cl.
CPC ........ *H01L 23/552* (2013.01); *H01L 21/4853* (2013.01); *H01L 21/4871* (2013.01);
(Continued)

(58) Field of Classification Search
CPC . H01L 23/552; H01L 21/565; H01L 21/4853; H01L 21/4871; H01L 21/78;
(Continued)

(56) References Cited

U.S. PATENT DOCUMENTS

| 5,977,626 A | 11/1999 | Wang et al. |
| 6,395,584 B2 | 5/2002 | Hsu et al. |

(Continued)

FOREIGN PATENT DOCUMENTS

| CN | 1909746 A | 2/2007 |
| CN | 101300911 A | 11/2008 |

(Continued)

*Primary Examiner* — Didarul A Mazumder
(74) *Attorney, Agent, or Firm* — McClure, Qualey & Rodack, LLP

(57) ABSTRACT

A package structure and a manufacturing method for the same are provided. The package structure includes a circuit, a mold sealing layer, a conductive metal board, and a conductive layer. The circuit board includes a substrate and a first electronic element disposed on the substrate. The mold sealing layer is disposed on the substrate and covers the first electronic element. The mold sealing layer has a top surface, a bottom surface corresponding to the top surface, and a side surface connected between the top surface and the bottom surface. The conductive metal board is disposed on the top surface and adjacent to the first electronic element. The conductive layer is disposed on the side surface and electrically connected to the conductive metal board. The conductive metal board and the conductive layer are each an independent component.

2 Claims, 19 Drawing Sheets

(51) Int. Cl.
  *H01L 23/31* (2006.01)
  *H01L 23/367* (2006.01)
  *H01L 21/78* (2006.01)
  *H01L 21/48* (2006.01)
  *H01L 23/498* (2006.01)

(52) U.S. Cl.
  CPC ............ *H01L 21/565* (2013.01); *H01L 21/78* (2013.01); *H01L 23/3121* (2013.01); *H01L 23/3675* (2013.01); *H01L 23/49838* (2013.01)

(58) Field of Classification Search
  CPC ............. H01L 23/3121; H01L 23/3675; H01L 23/49838
  USPC ........................................................ 257/659
  See application file for complete search history.

(56) References Cited

U.S. PATENT DOCUMENTS

| | | | |
|---|---|---|---|
| 6,534,859 | B1 | 3/2003 | Shim et al. |
| 8,110,441 | B2 | 2/2012 | Chandra et al. |
| 8,502,339 | B2 | 8/2013 | Lin et al. |
| 9,449,903 | B2 | 9/2016 | McLellan et al. |
| 10,438,901 | B1 | 10/2019 | Krefft et al. |
| 10,453,762 | B2 | 10/2019 | Watanabe et al. |
| 2006/0186551 | A1* | 8/2006 | Lange ................. H01L 23/3107 257/E23.125 |
| 2006/0266547 | A1* | 11/2006 | Koga ................... H05K 1/0218 257/E23.125 |
| 2007/0020021 | A1 | 1/2007 | Snyder et al. |
| 2007/0025570 | A1 | 2/2007 | Yonehara et al. |
| 2007/0190858 | A1* | 8/2007 | Stoneham ........... H05K 9/0031 439/607.01 |
| 2008/0210462 | A1* | 9/2008 | Kawagishi ............. H01L 24/97 29/841 |
| 2010/0244193 | A1 | 9/2010 | Lin et al. |
| 2012/0086109 | A1* | 4/2012 | Kim ..................... H01L 21/561 257/659 |
| 2012/0243191 | A1 | 9/2012 | Wu |
| 2014/0183712 | A1 | 7/2014 | McLellan et al. |
| 2016/0338228 | A1 | 11/2016 | Suzuki et al. |
| 2017/0295679 | A1* | 10/2017 | Kim ..................... H05K 1/188 |
| 2017/0347462 | A1 | 11/2017 | Miwa |
| 2019/0304926 | A1 | 10/2019 | Ryu et al. |
| 2020/0203287 | A1 | 6/2020 | Krefft et al. |

FOREIGN PATENT DOCUMENTS

| | | |
|---|---|---|
| TW | I491010 B | 7/2015 |
| TW | 201818529 A | 5/2018 |
| TW | 201921632 A | 6/2019 |
| TW | 202021054 A | 6/2020 |

* cited by examiner

PACKAGE STRUCTURE COMPRISING CONDUCTIVE METAL BOARD AND GROUND ELEMENT

CROSS-REFERENCE TO RELATED PATENT APPLICATION

This application is a divisional application of the U.S. application Ser. No. 17/015,140, filed on Sep. 9, 2020 and entitled "PACKAGE STRUCTURE AND METHOD FOR MANUFACTURING THE SAME", the entire disclosures of which are incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a package structure and a method for manufacturing the same.

BACKGROUND OF THE DISCLOSURE

The existing package structure mostly has the ability of electromagnetic shielding. In a 5G (5th-generation) communication technology or an automotive field, in addition to the need of electromagnetic shielding for wireless communication chip or digital chip with high performance, the heat dissipation efficiency of the abovementioned chips directly influences their overall performance and reliability. However, while the existing chip architecture focuses on the ability of electromagnetic shielding, the heat dissipation efficiency remains to be improved.

Therefore, how to improve the heat dissipation efficiency of the package structure with electromagnetic shielding by modifying the packaging architecture has become a critical topic in the industry.

SUMMARY OF THE DISCLOSURE

In response to the above-referenced technical inadequacies, the present disclosure provides a package structure and a manufacturing method for the same.

In one aspect, the present disclosure provides a package structure. The package structure includes a circuit, a mold sealing layer, a conductive metal board, and a conductive layer. The circuit board includes a substrate and a first electronic element disposed on the substrate. The mold sealing layer is disposed on the substrate and covers the first electronic element. The mold sealing layer has a top surface, a bottom surface corresponding to the top surface, and a side surface connected between the top surface and the bottom surface. The conductive metal board is disposed on the top surface and adjacent to the first electronic element. The conductive layer is disposed on the side surface and electrically connected to the conductive metal board. The conductive metal board and the conductive layer are each an independent component.

In certain embodiments, the present disclosure provides a method for manufacturing a package structure. The method includes: providing a circuit board module, with the circuit board module including a substrate component part and a plurality of first electronic elements being disposed on the substrate component part; coating a sealing compound to the circuit board module to cover the plurality of first electronic elements; disposing a conductive metal board module on the sealing compound that has not solidified; solidifying the sealing compound to form a mold sealing structure that is combined to the conductive metal board module by the sealing compound, with the mold sealing structure covering the plurality of first electronic elements; cutting the conductive metal board module and the mold sealing structure to form a plurality of containing grooves, and expose a conductive ground element of the substrate component part from the plurality of containing grooves; forming a conductive coating layer in the plurality of containing grooves, with the conductive coating layer being electrically connected to the conductive ground element and the conductive metal board module; and cutting the conductive coating layer apart to form a plurality of package structures.

In another aspect, the present disclosure provides a method for manufacturing a package structure. The method includes: providing a circuit board module, with the circuit board module including a substrate component part and a plurality of first electronic elements disposed on the substrate component part; coating a sealing adhesive on the circuit board module to cover the plurality of first electronic elements; disposing a plurality of conductive metal boards the sealing compound which has not solidified; solidifying the sealing compound to form a mold sealing structure combining the conductive metal board with the sealing compound, the mold sealing structure covering the plurality of first electronic elements; cutting the mold sealing structure and the substrate component part form a plurality of package structures to be coated; and forming a conductive layer on the plurality of package structures to be coated.

Therefore, by virtue of "the conductive metal board being disposed on the top surface and adjacent to the first electronic element", "the conductive layer being disposed on the side surface and electrically connected to the conductive metal board" and "the conductive metal board and the conductive layer being each an independent component", the package structure U of the present disclosure has the ability of electromagnetic shielding, and the heat dissipation efficiency of the package structure is also improved. In addition, by virtue of "disposing a conductive metal board module on the sealing compound that has not solidified" and "forming a conductive coating layer on the plurality of containing grooves, with the conductive coating layer being electrically connected to the conductive ground element and conductive metal board module", the package structure of the present disclosure has the ability of electromagnetic shielding and the heat dissipation efficiency of the package structure is also improved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
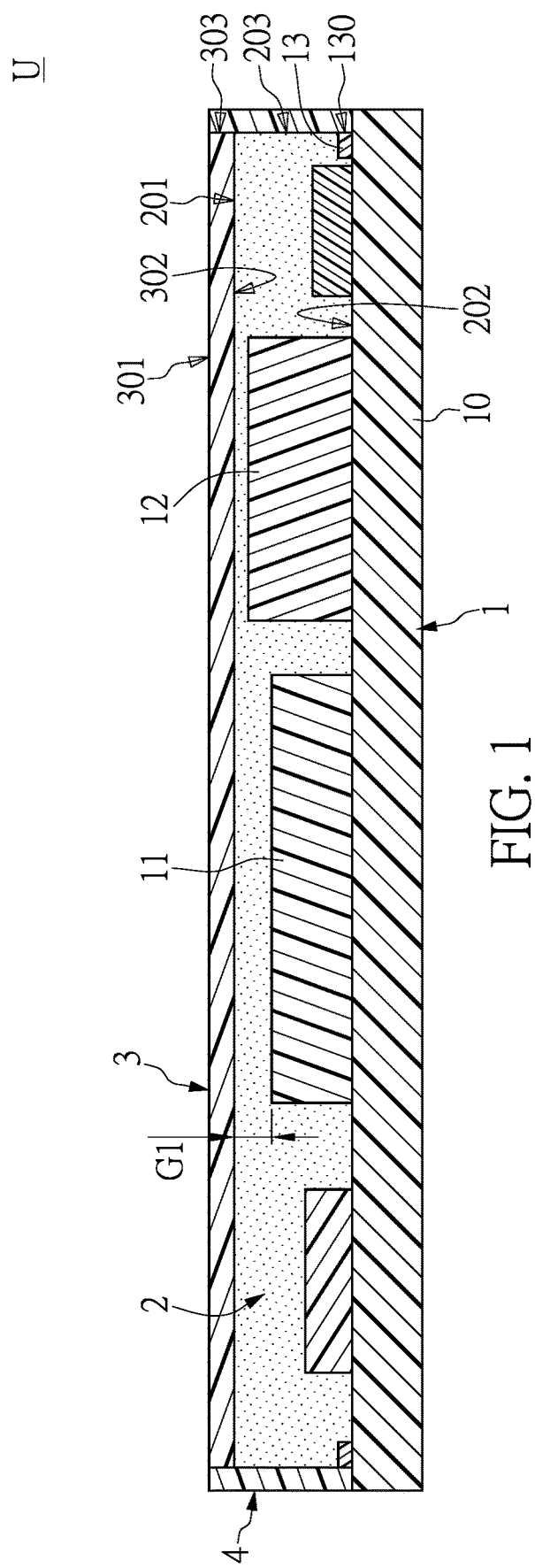
FIG. 1 illustrates a sectional view of an implementation of a package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Reference is made to FIG. 1, which illustrates a sectional view of a package structure according to a first embodiment of the present disclosure. The present disclosure provides a package structure U and a production method thereof. The first embodiment introduces an entire architecture of the package structure U, and the method for manufacturing the package structure U will be explained in the following embodiments. In addition, it should be noted that in one embodiment, the package structure U and the production method thereof provided in the present disclosure may be utilized in packaging semi-conductor elements, chips, circuits, and the like, which is not limited in the present disclosure. In addition, in one embodiment, the package structure U and the production method thereof provided in the present disclosure may be applicable to RF SiP (radio-frequency system in package).

Referring to 1, the package structure U includes a circuit board 1, a mold sealing layer 2, a conductive metal board 3, and a conductive layer 4. The circuit board 1 includes a substrate 10 and a first electronic element 11 disposed on substrate 10. For example, the circuit board 1 may be a PCB (printed circuit board), and the first electronic element 11 may be a chip or wires disposed on the substrate 10. In addition, the circuit board 1 further includes at least one of a second electronic element 12 and other electronic elements (not shown in FIG. 1) disposed on the substrate 10, and the second electronic element 12 may be a chip or wires disposed on the substrate 10. However, the present disclosure is not limited to the abovementioned examples.

The mold sealing layer 2 is disposed on the substrate 10 and directly contacts and covers the first electronic element 11 and the second electronic element 12. The mold sealing layer 2 has a top surface 201, a bottom surface 202 corresponding to the top surface 201, and a side surface 203 connected between the top surface 201 and the bottom surface 202. In addition, the conductive metal board 3 is disposed on the top surface 201 of the mold sealing layer 2, and a vertical projection of the conductive metal board 3 onto the top surface 201 of the mold sealing layer 2 at least partially overlaps with vertical projections of the first electronic element 11 and the second electronic element 12 onto the top surface 201 of the mold sealing layer 2. In addition, the conductive layer 4 is disposed on the side surface 203 of the mold sealing layer 2 and electrically connected to conductive metal board 3, and the conductive metal board 3 and the conductive layer 4 are each an independent component.

For example, the mold sealing layer 2 may be made of resin, e.g., epoxy resin or silica gel the conductive metal board 3 may be a conductive board, e.g., a pre-formed metal heat dissipation foil, and the conductive layer 4 is a coating layer which is formed by an overlay or a colloid. However, it should be noted that actual materials of the mold sealing layer 2, the conductive metal board 3 and the conductive layer 4 are not limited in the present disclosure. In addition, it should be noted that conductive metal board 3 and the conductive layer 4 being each an independent component indicates that the conductive metal board 3 and the conductive layer 4 are made of different materials. Alternatively, the conductive metal board 3 and the conductive layer 4 are made of a same base material but are respectively doped with other materials having different characteristics, such that the conductive metal board 3 and the conductive layer 4 have different material characteristics.

The conductive metal board 3 has a top face 301, a bottom face 302 corresponding to the top face 301, and a side face 303 connected between the top face 301 and the bottom surface. The bottom face 302 of the conductive metal board 3 adheres to the top surface 201 of the mold sealing layer 2. In addition, the conductive layer 4 simultaneously abuts against the side surface 203 of the mold sealing layer 2 and the side face 303 of the conductive metal board 3, so that the conductive layer 4 is electrically connected to the conductive metal board 3. In addition, in the present disclosure, the circuit board 1 further includes a conductive ground element 13 disposed on the substrate 10. The conductive metal board 3 and the conductive layer 4 are electrically connected to the conductive ground element 13, and the conductive layer 4 is electrically connected between the conductive metal board 3 and the conductive ground element 13, i.e., the conductive layer 4 is cascaded on a conduction path between the conductive metal board 3 and the conductive ground element 13. In addition, for example, the conductive ground element 13 has an exposed surface 130 for which the substrate 10 is exposed, and the conductive layer 4 simultaneously abuts against the side surface 203 of the mold sealing layer 2, the side face 303 of the conductive metal board 3 and exposed surface 130, thereby the conductive layer 4 is electrically connected to the conductive metal board 3 and the conductive ground element 13. However, in other embodiments, the conductive layer 4 may simultaneously abut against the side surface 203 of the mold sealing layer 2, the side face 303 of the conductive metal board 3, at least a portion of the top face 301 of the conductive metal board 3 and the exposed surface 130 of the conductive ground element 13, thereby the conductive layer 4 is electrically connected to the conductive metal board 3 and the conductive ground element 13. In addition, in other embodiments, the conductive layer 4 may simultaneously abut against the side surface 203 of the mold sealing layer 2, the top surface 201 of the mold sealing layer 2, the side face 303 of the conductive metal board 3 and the exposed surface 130 of the conductive ground element 13, thereby the conductive layer 4 is electrically connected to the conductive metal board 3 and the conductive ground element 13. In other words, the present disclosure can be provided without limiting which surfaces of the mold sealing layer 2 and the conductive metal board 3 that the conductive layer 4 abuts against. With this structure, the conductive metal board 3 and the conductive layer 4 are connected to the ground through the conductive ground element 13 of the circuit board 1. In addition, by connecting the conductive metal board 3 and the conductive layer 4 to the ground, the package structure U is shielded from electromagnetic interference.

Referring to FIG. 1, in one embodiment of the present disclosure, the first electronic element 11 may be an element that generates heat the most on the circuit board 1, and the conductive metal board 3 is disposed on the top surface 201 of the mold sealing layer 2 and adjacent to the first electronic element 11. With this structure, since the conductive metal board 3 is disposed adjacent to the first electronic element 11, the present disclosure utilizes the conductive metal board 3 to absorb an amount of heat that is generated by the first electronic element 11, in order to facilitate the heat dissipation efficiency of the first electronic element 11. Preferably, in the present disclosure, only the mold sealing layer 2 is disposed between the conductive metal board 3 and the first electronic element 11, that is, the bottom face 302 of the conductive metal board 3 directly contacts and covers onto the top surface 201 of the mold sealing layer 2. However, in other embodiments, a thermal pad or a thermal paste may be disposed between the conductive metal board 3 and the first electronic element 11, which is not limited in the present disclosure. In addition, it should be noted that the present disclosure takes an example where only the mold sealing layer 2 is disposed between the conductive metal board 3 and the first electronic element 11, and the bottom face 302 of the conductive metal board 3 is closely adjacent to the first electronic element 11. For example, a first predetermined gap G1 may be smaller than 500 micrometers (μm), and preferably, the first predetermined gap G1 may be smaller than 100 micrometers. With this structure, the first electronic element 11 is disposed as closely adjacent as possible to the conductive metal board 3 in order to facilitate the heat dissipation efficiency of the first electronic element, which is not limited in the present disclosure.

Figure 2:
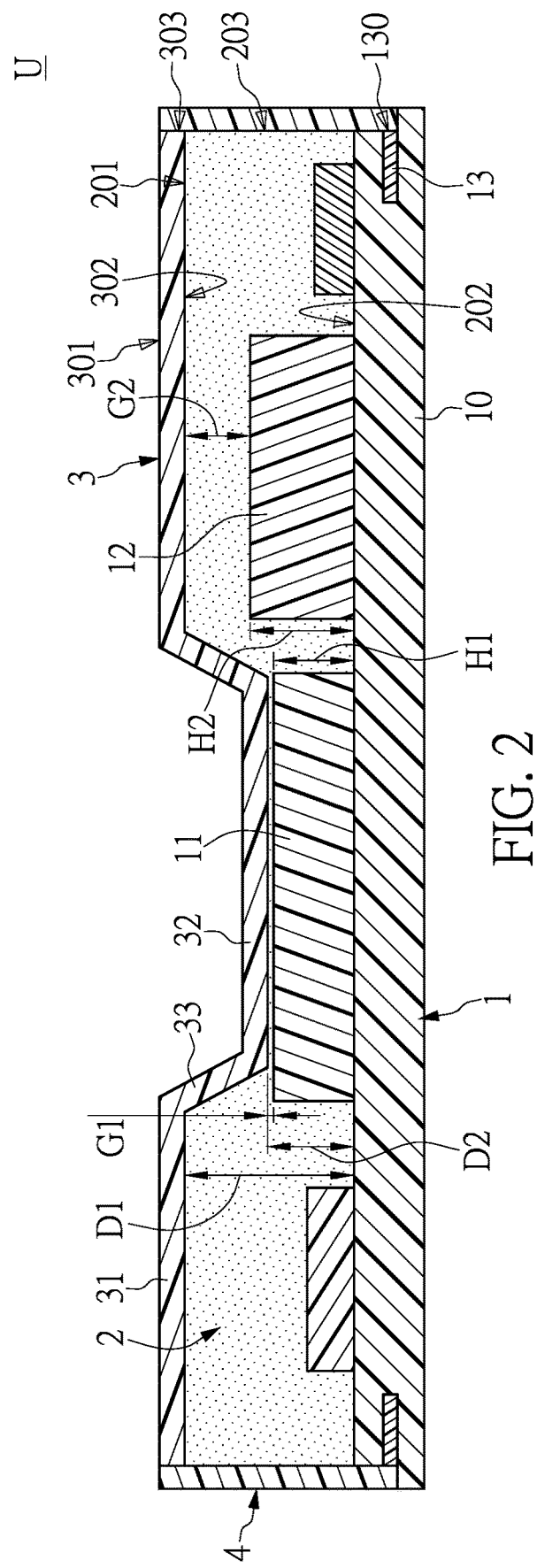
FIG. 2 illustrates a sectional view of another implementation of the package structure according to the first embodiment of the present disclosure.

Reference is made to FIG. 2, which illustrates another sectional view of the package structure according to the first embodiment of the present disclosure. As can be seen by comparing FIG. 2 with FIG. 1, in the embodiment of FIG. 2, the shape of the conductive metal board 3 is changed, so that the conductive metal board 3 is more adjacent to the first electronic element 11 in order to facilitate the heat dissipation efficiency of the first electronic element 11. Moreover, compared with the implementation of FIG. 1 in which the conductive ground element 13 is disposed on the surface of the substrate 10, the conductive ground element 13 is embedded into the substrate 10 in the implementation of FIG. 2. However, the present disclosure can be provided without limiting the location of the conductive ground element 13. It is worth noting that, in some situations, the second electronic element 12 and the conductive metal board 3 may interfere with each other (e.g., cross talk) when they are disposed too adjacent to each other. Therefore, in order to facilitate the heat dissipation efficiency of the first electronic element 11 and prevent the second electronic element 12 from experiencing electromagnetic interference at the same time, in the embodiment of FIG. 2, the second electronic element 12 is more distant away from the conductive metal board 3 than the first electronic element 11, i.e., the first electronic element 11 is disposed more adjacent to the conductive metal board 3 than the second electronic element 12. In addition, it should be noted that characteristics of other components of the package structure U in FIG. 2 are similar to those of the package structure U in FIG. 1, and will not be reiterated herein.

In the embodiment of FIG. 2, the first electronic element 11 has a first predetermined height H1, the second electronic element 12 has a second predetermined height H2, and the first predetermined height H1 is smaller than the second predetermined height H2. In addition, a first predetermined gap G1 is defined between the first electronic element 11 and the conductive metal board 3, a second predetermined gap G2 is defined between the second electronic element 12 and the conductive metal board 3, and the first predetermined gap G1 is smaller than the second predetermined gap G2. For example, the first predetermined gap G1 may be smaller than 500 micrometers, and preferably, the first predetermined gap G1 may be smaller than 100 micrometers, which is not limited in the present disclosure.

The conductive metal board 3 includes a body portion 31 and a heat dissipating portion 32 connected to the body portion 31. The heat dissipating portion 32 is in a concave shape relative to the body portion 31, thereby the heat dissipating portion 32 is disposed adjacent to the first electronic element 11, and the heat dissipating portion 32 is disposed more adjacent to the substrate 10 than the body portion 31. In addition, a vertical projection of the heat dissipating portion 32 onto the substrate 10 at least partially overlaps with a vertical projection of the first electronic element 11 onto the substrate 10, the body portion 31 is disposed adjacent to the second electronic element 12, and a vertical projection of the body portion 31 onto the substrate 10 at least partially overlaps with a vertical projection of the second electronic element 12 onto the substrate 10. In addition, the conductive metal board 3 further includes a connecting portion 33 connected between the body portion 31 and the heat dissipating portion 32, the bottom face 302 located on the body portion 31 is parallel to the bottom face 302 located on the heat dissipating portion 32, and the bottom face 302 located on the connecting portion 33 ramps down from the bottom face 302 located on the body portion 31 to the bottom face 302 located on the heat dissipating portion 32.

Moreover, a first predetermined distance D1 is defined between the bottom face 302 located on the body portion 31 of the conductive metal board 3 and the bottom surface 202 of the mold sealing layer 2, a second predetermined distance D2 is defined between the bottom face 302 located on the heat dissipating portion 32 of the conductive metal board 3 and the bottom surface 202 of the mold sealing layer 2, and the first predetermined distance D1 is greater than the second predetermined distance D2.

Figure 3:
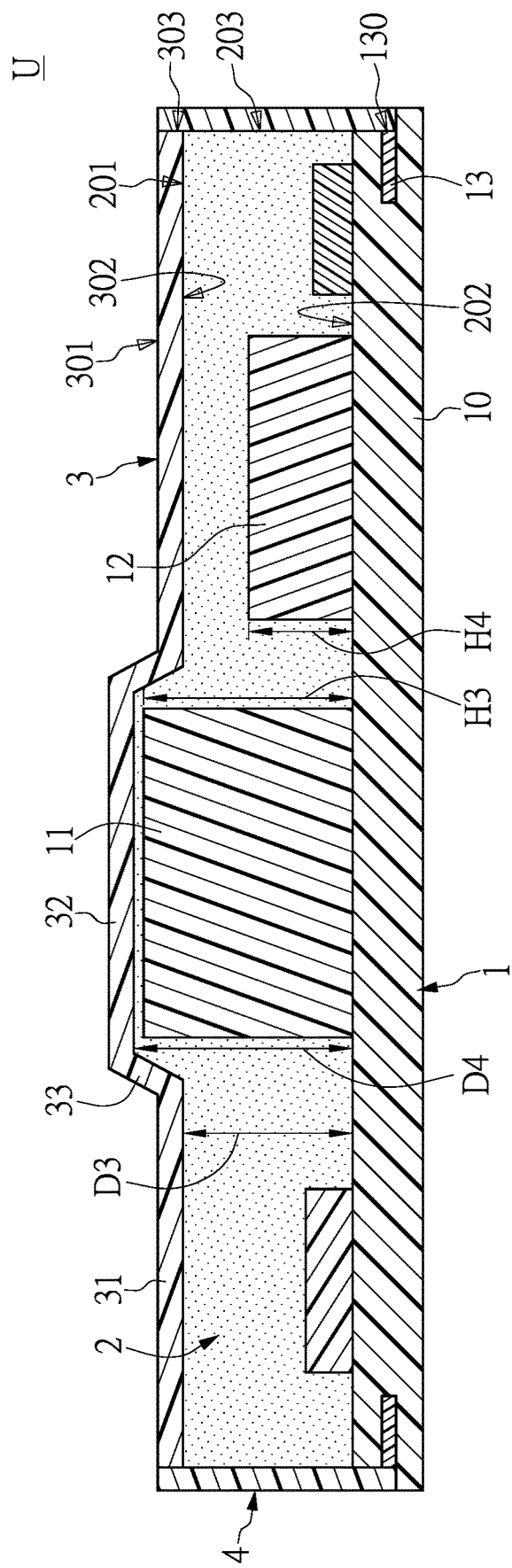
FIG. 3 illustrates a sectional view of yet another implementation of the package structure according to the first embodiment of the present disclosure.

Reference is made to FIG. 3, which illustrates another sectional view of the package structure according to the first embodiment of the present disclosure. As can be seen by comparing FIG. 3 with FIG. 1, in the embodiment of FIG. 3, the shape of the conductive metal board 3 may be modified in order to accommodate to a height of the first electronic element 11, so as to facilitate the heat dissipation efficiency of the first electronic element 11. In addition, it should be noted that other structures of the package structure U in FIG. 3 are similar to those of the package structure U in FIG. 1, which is omitted.

In the embodiment of FIG. 3, the first electronic element 11 has a third predetermined height H3, the second electronic element 12 has a fourth predetermined height H4, and the third predetermined height H3 is greater than the fourth predetermined height H4. In addition, a first predetermined gap G1 is defined between the first electronic element 11 and the conductive metal board 3, a second predetermined gap G2 is defined between the second electronic element 12 and the conductive metal board 3, and the first predetermined gap G1 is smaller than the second predetermined gap G2. For example, the first predetermined gap G1 may be smaller than 500 micrometers, and preferably, the first predetermined gap G1 may be smaller than 100 micrometers, which is not limited in the present disclosure.

In detail, in the embodiment of FIG. 3, the heat dissipating portion 32 of the conductive metal board 3 is convex relative to the body portion 31 of the conductive metal board 3, a vertical projection of the heat dissipating portion 32 onto substrate 10 at least partially overlaps with a vertical projection of the first electronic element 11 onto the substrate 10, and body portion 31 is disposed more adjacent to the substrate 10 than the heat dissipating portion 32. In addition, a third predetermined distance D3 is defined between the bottom face 302 located on the conductive the body portion 31 of the metal board 3 and the bottom surface 202 of the mold sealing layer 2, a fourth predetermined distance D4 is defined between the bottom face 302 located on the heat dissipating portion 32 of the conductive metal board 3 and the bottom surface 202 of the mold sealing layer 2, and the third predetermined distance D3 is smaller than the fourth predetermined distance D4. In addition, the bottom face 302 located on body portion 31 is parallel to the bottom face 302 located on the heat dissipating portion 32, and the bottom face 302 located on connecting portion 33 ramps up from bottom face 302 located on body portion 31 to the bottom face 302 located on the heat dissipating portion 32.

Second Embodiment

Referring to FIG. 4 and FIG. 6 to FIG. 13, FIG. 4 is a flow chart of a method for manufacturing a package structure according to a second embodiment of the present disclosure, FIG. 6 to FIG. 13 are schematic diagrams of a plurality of steps of the method for manufacturing the package structure according to the second embodiment of the present disclosure, respectively. It should be noted that characteristics of each element in a method for manufacturing the package structure U provided in the second embodiment are similar to those in the abovementioned embodiment, and will not be reiterated herein. In addition, the second embodiment takes the package structure U in FIG. 2 for example, and the package structures U in FIG. 1 and FIG. 3 may be produced according to the method for manufacturing the package structure U provided in the second embodiment.

Figure 4:
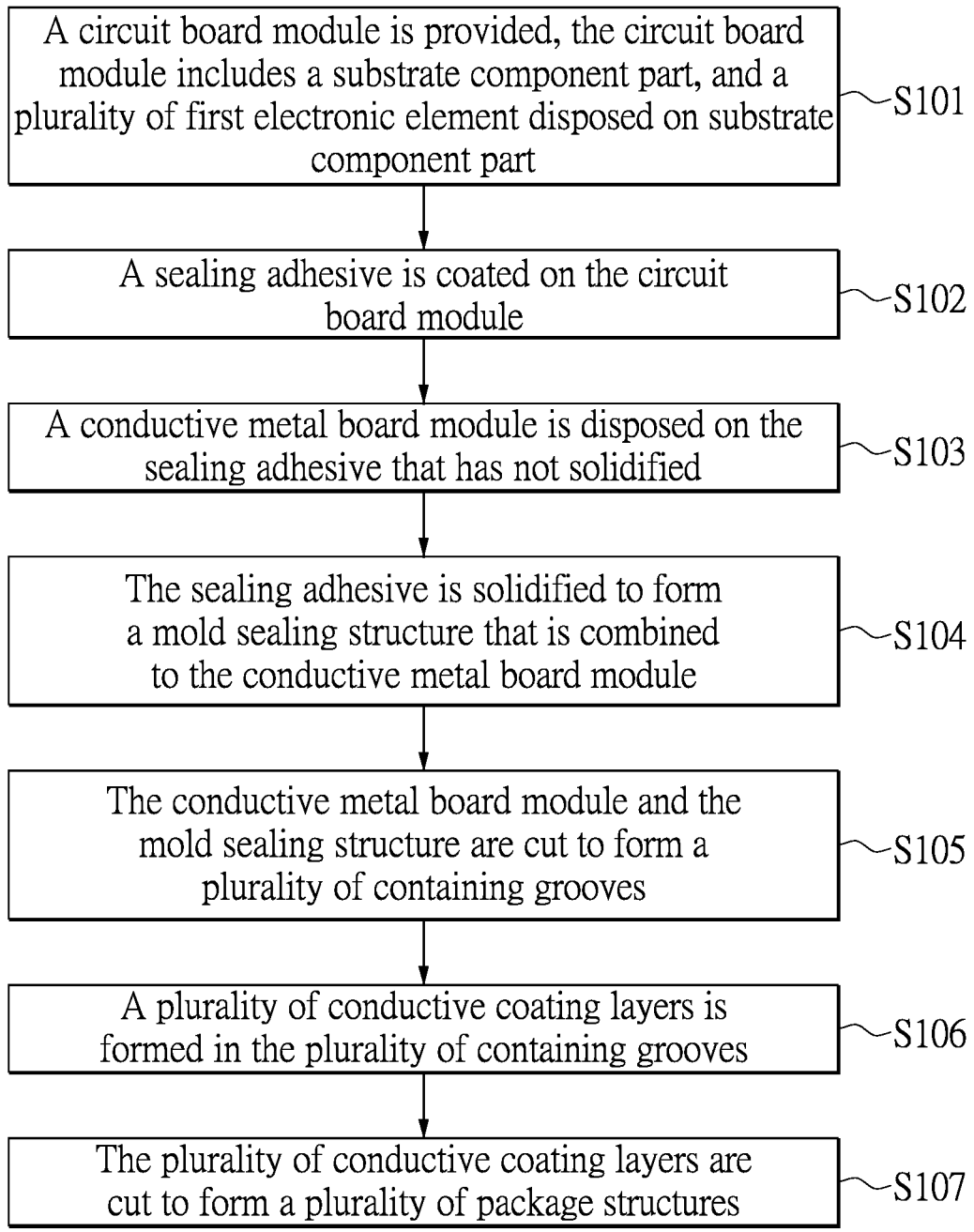
FIG. 4 is a flow chart of a method for manufacturing a package structure according to a second embodiment of the present disclosure.
Figure 6:
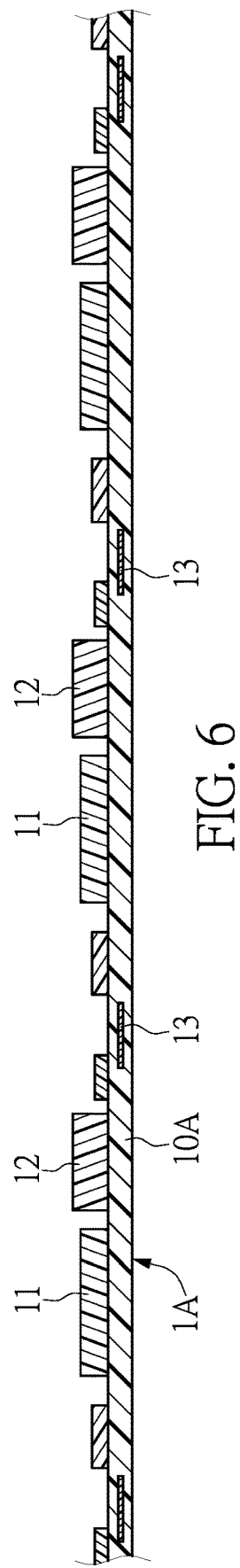
FIG. 6 is a schematic view of a step of the method for manufacturing the package structure according to the second embodiment of the present disclosure.

Referring to FIG. 4 and FIG. 6, in the step S101, a circuit board module 1A is provided. The circuit board module 1A includes a substrate component part 10A, and a plurality of first electronic element 11 disposed on substrate component part 10A. For example, the substrate component part 10A includes a plurality of substrates 10 in which each of the plurality of substrates 10 is equivalent to the substrate 10 in FIG. 1 to FIG. 3, that is, the plurality of substrates 10 are connected before the substrate component part 10A is divided apart in the following process. In addition, a plurality of second electronic elements 12 and a plurality of conductive ground elements 13 are disposed on the substrate component part 10A.

Figure 7:
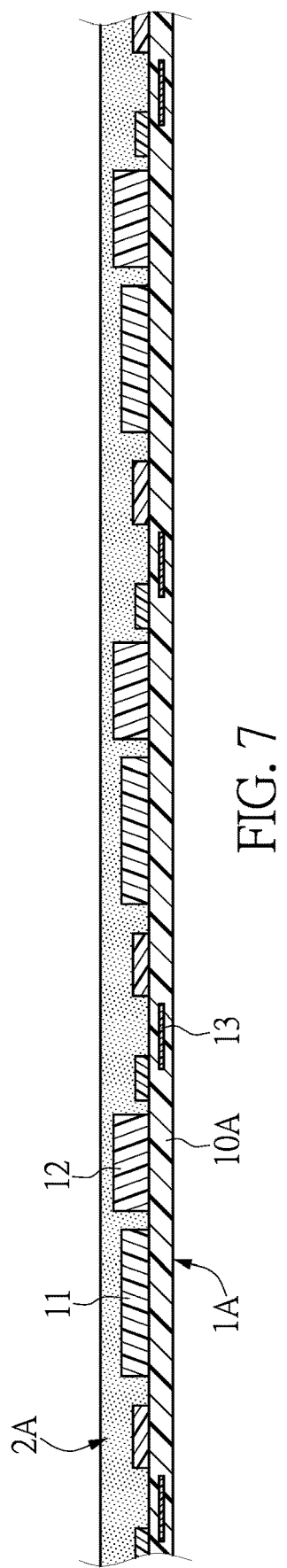
FIG. 7 is a schematic view of another step of the method for manufacturing the package structure according to the second embodiment of the present disclosure.

Referring to FIG. 4 and FIG. 7, in the step S102: a sealing compound 2A is coated on the circuit board module 1A. For example, the sealing compound 2A is utilized to cover the plurality of first electronic element 11 and the second electronic element 12. In addition, in the step of the sealing compound 2A on the circuit board module 1A, the sealing compound 2A is coated under a vacuum environment having a predetermined vacuum pressure to cover the plurality of first electronic elements 11 and the second electronic elements 12. In other words, the sealing compound 2A is coated on the circuit board module 1A by a VPES (vacuum printing encapsulation system), in order to cover the plurality of first electronic elements 11 and the second electronic elements 12, which is not limited in the present disclosure. In other embodiments, in the step of coating the sealing compound 2A on the circuit board module 1A, the sealing compound 2A may be coated under an atmospheric pressure environment. In addition, it should be noted that the material and characteristics of the sealing compound 2A are similar to that of the mold sealing layer 2 in the abovementioned embodiment, and will not be reiterated herein.

Figure 8:
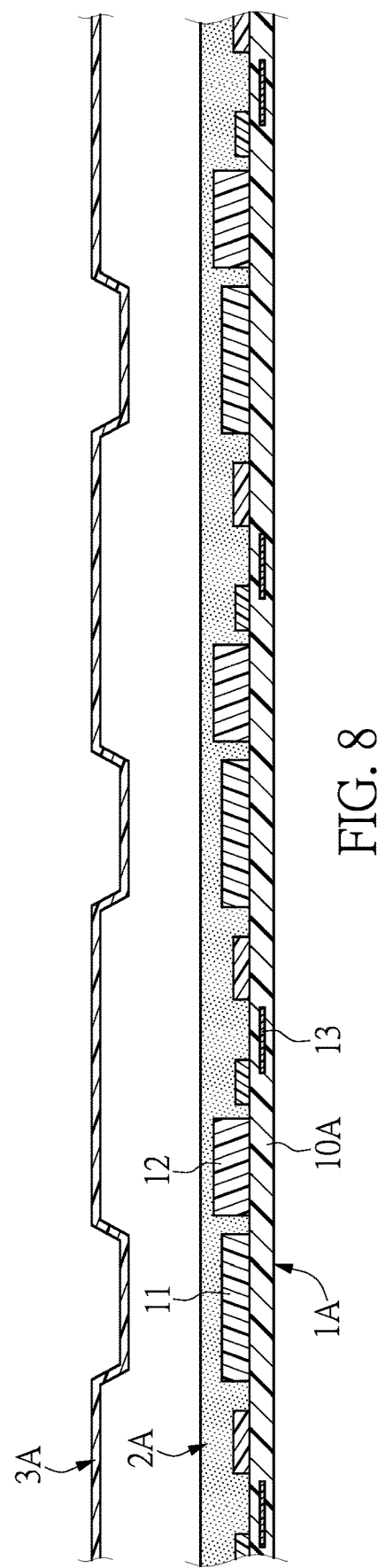
FIG. 8 is a schematic view of yet another step of the method for manufacturing the package structure according to the second embodiment of the present disclosure.
Figure 9:
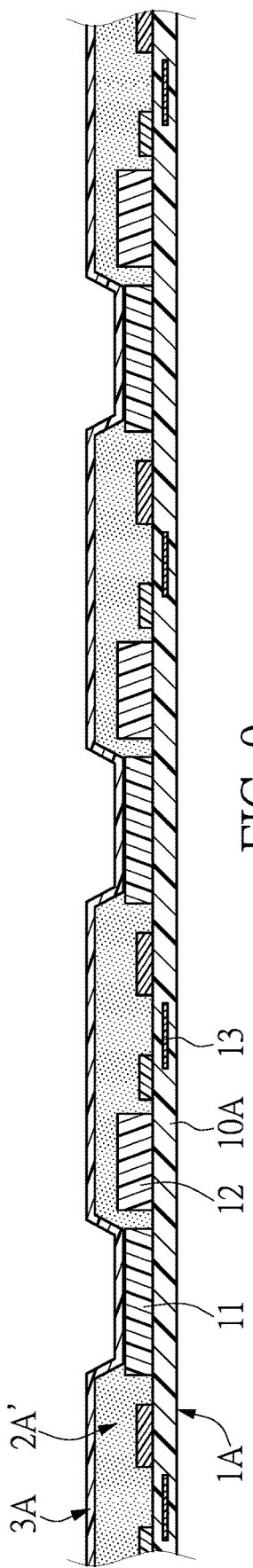
FIG. 9 is a schematic view of another step of the method for manufacturing the package structure according to the second embodiment of the present disclosure.

Referring to FIG. 4, FIG. 8 and FIG. 9, in the step S103: a conductive metal board module 3A is disposed on the sealing compound 2A that has not solidified. In the present disclosure, under the circumstance that the conductive metal board module 3A is disposed on the sealing compound 2A that has not solidified, the sealing compound 2A may be reshaped by the contour of the conductive metal board module 3A when the conductive metal board module 3A has a concave shape or a convex shape, and a portion of the conductive metal board module 3A is disposed more adjacent to the first electronic element 11.

Referring to FIG. 4 and FIG. 9, in the step S104: the sealing compound 2A is solidified to form a mold sealing structure 2A' that is combined to the conductive metal board module 3A. For example, in the step of solidifying the sealing compound 2A to form the mold sealing structure 2A' that is combined to the conductive metal board module 3A, the sealing compound 2A may be solidified by natural solidification or heat solidification, so as to form the mold sealing structure 2A' that is solidified and/or fixed in shape. For example, the heat solidification may refer to baking. In addition, it should be noted that the mold sealing structure 2A' includes a plurality of mold sealing layers 2 in which each of the plurality of mold sealing layers 2 is equivalent to the mold sealing layer 2 in FIG. 1 to FIG. 3, that is, the plurality of mold sealing layers 2 are connected before the mold sealing structure 2A' is divided apart in the following process. With this structure, since the conductive metal board module 3A is disposed on the sealing compound 2A that has not solidified, the conductive metal board module 3A may adhere to the mold sealing structure 2A' when the sealing compound 2A is solidified into the mold sealing structure 2A'. That is to say, in the step of solidifying the sealing compound 2A to form the mold sealing structure 2A', the conductive metal board module 3A is combined to the mold sealing structure 2A', i.e., the conductive metal board module 3A directly contacts and adheres to the mold sealing structure 2A' through bonding.

Figure 10:
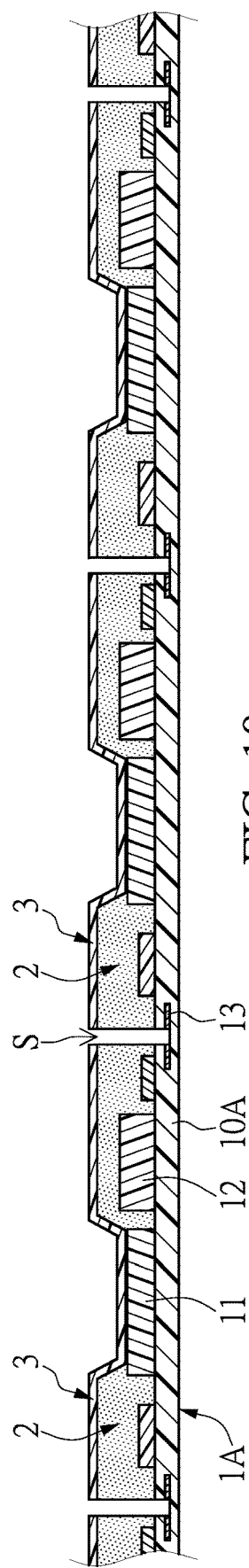
FIG. 10 is a schematic view of another step of the method for manufacturing the package structure according to the second embodiment of the present disclosure.
Figure 11:
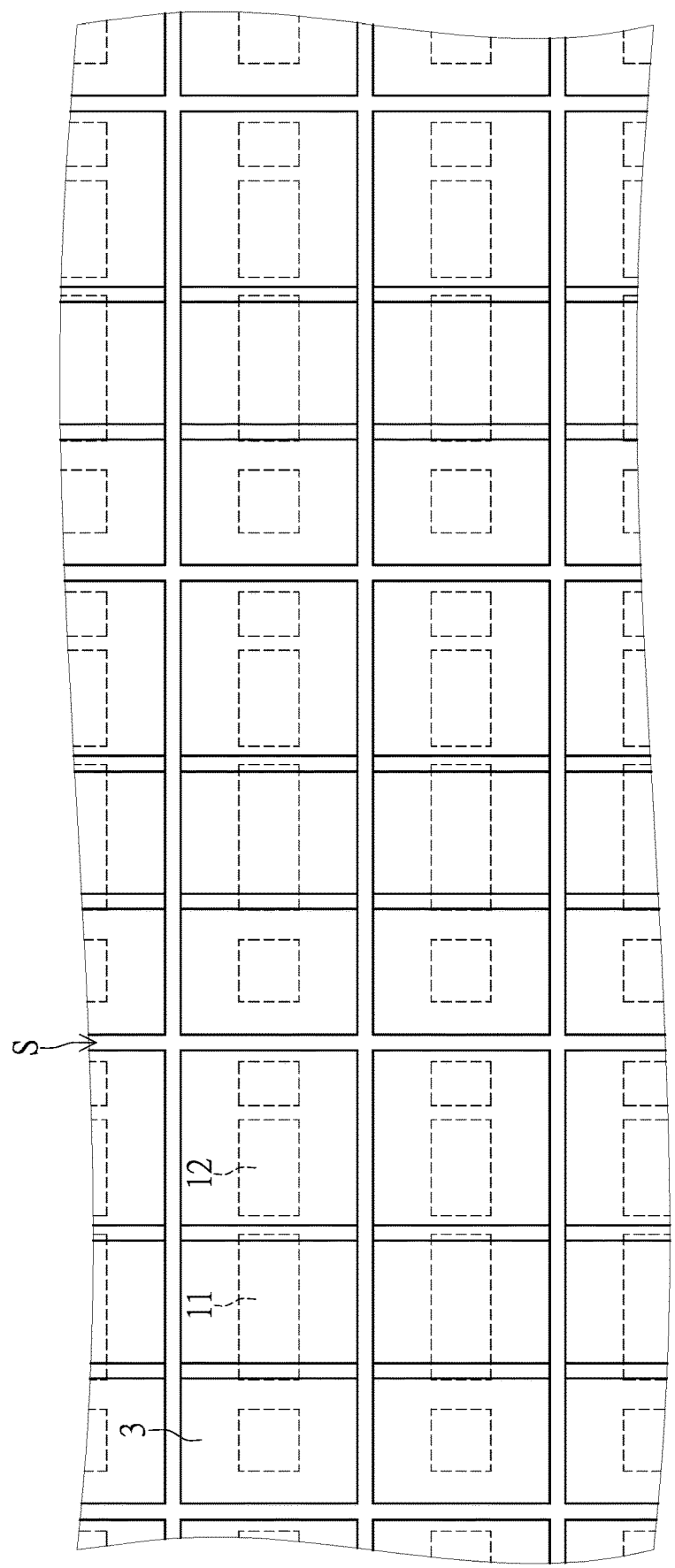
FIG. 11 illustrates a top view of the package structure in FIG. 10.

Referring to FIG. 4, FIG. 10 and FIG. 11, in the step S105: the conductive metal board module 3A and the mold sealing structure 2A' are cut to form a plurality of containing grooves S. For example, in the step of cutting the conductive metal board module 3A and the mold sealing structure 2A' to form the plurality of containing grooves S, a plurality of conductive ground elements 13 in the substrate component part 10A may be respectively exposed from the plurality of containing grooves S. In other words, in the step of cutting the conductive metal board module 3A and the mold sealing structure 2A' to form the plurality of containing grooves S, the conductive metal board module 3A is divided into the plurality of conductive metal boards 3, and the mold sealing structure 2A' is divided into the plurality of mold sealing layers 2.

Each of the plurality of conductive metal boards 3 corresponds to each of the plurality of first electronic elements 11 and each of the plurality of the second electronic elements 12, respectively, and each of the plurality of conductive metal boards 3 includes a body portion 31 and a heat dissipating portion 32 connected to the body portion 31. A vertical projection of the heat dissipating portion 32 onto the substrate component part 10A at least partially overlaps with a vertical projection of the first electronic element 11 onto the substrate component part 10A, and a vertical projection of the body portion 31 onto substrate component part 10A at least partially overlaps with a vertical projection of the second electronic element 12 onto the substrate component part 10A. In addition, when the second embodiment of the present disclosure is applied with the implementation of FIG. 2, the heat dissipating portion 32 is in a concave shape relative to the body portion 31, and the heat dissipating portion 32 is disposed more adjacent to the substrate component part 10A than the body portion 31. However, when the second embodiment of the present disclosure is applied with the implementation of FIG. 3, the heat dissipating portion 32 is convex relative to the body portion 31, and the body portion 31 is disposed more adjacent to the substrate component part 10A than the heat dissipating portion 32.

In addition, in the implementation of FIG. 2, since the conductive ground element 13 is embedded into the substrate 10, in the step of cutting the conductive metal board module 3A and the mold sealing structure 2A' to form the plurality of containing grooves S, at least a portion of the substrate component part 10A is cut to expose the plurality of conductive ground elements 13 located in the substrate component part 10A from the plurality of containing grooves S. In addition, it should be noted that, for convenience of the subsequent procedures, in the step of cutting at least a portion of the substrate component part 10A, the substrate component part 10A can be not completely cut apart. However, the present disclosure is not limited thereto.

Figure 5:
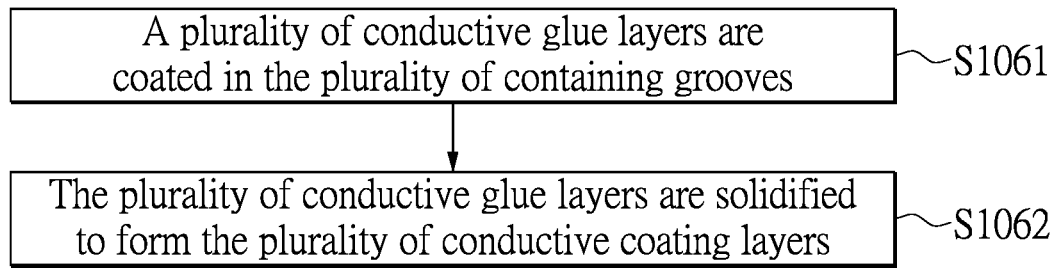
FIG. 5 is a schematic diagram of the step S106 of the method for manufacturing the package structure according to the second embodiment of the present disclosure.
Figure 12:
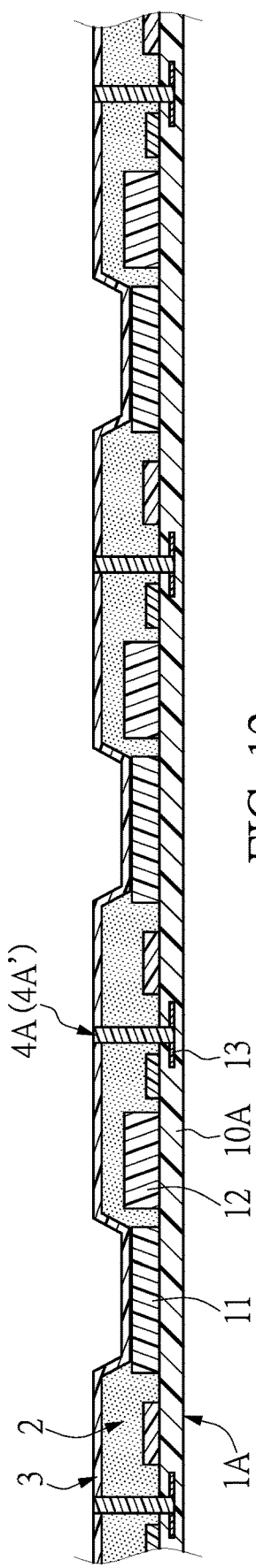
FIG. 12 is a schematic view of another step of the method for manufacturing the package structure according to the second embodiment of the present disclosure.

Referring to FIG. 4, FIG. 5 and FIG. 12, FIG. 5 is a schematic diagram of the step S106 of the method for manufacturing the package structure according to the second embodiment of the present disclosure. In the step S106: a plurality of conductive coating layers 4A' is formed in the plurality of containing grooves S. For example, the plurality of the conductive ground elements 13 are electrically connected to the plurality of conductive metal boards 3 through the plurality of conductive coating layers 4A'.

The steps of forming the plurality of conductive coating layers 4A' in the plurality of containing grooves S are as follows. In the step S1061, a plurality of conductive layers 4A are coated in the plurality of containing grooves S. For example, in the step of coating the plurality of conductive layers 4A in the plurality of containing grooves S, the plurality of conductive layers 4A are coated under a vacuum environment having a predetermined vacuum pressure, which is not limited in the present disclosure. In other words, the plurality of conductive layers 4A are coated in the plurality of containing grooves S by a VPES, which is not limited in the present disclosure. In other embodiments, in the step of coating the plurality of conductive layers 4A in the plurality of containing grooves S, the plurality of conductive layers 4A may be coated under an atmospheric pressure environment. In addition, it should be noted that each of the plurality of conductive layers 4A is a coating layer or a colloid, and may be coated in the plurality of containing grooves S by spraying or printing. Furthermore, in the step S1062, the plurality of conductive layers 4A are solidified to form the plurality of conductive coating layers 4A'. For example, in the step of solidifying the plurality of conductive layers 4A, the plurality of conductive layers 4A may be solidified by natural solidification or heat solidification, to thereby form the plurality of conductive coating layers 4A' that are solidified and/or fixed in shape. With this structure, in the step S106, the plurality of conductive coating layers 4A' that is used for electrically connecting the conductive ground element 13 and the conductive metal board module 3A are formed by forming the plurality of conductive layers 4A in the plurality of containing grooves S. In addition, the plurality of conductive layers 4A are equivalent to the plurality of conductive coating layers 4A' that have not solidified, and each of the plurality of conductive coating layers 4A' is equivalent to two adjacent conductive layers 4 that are connected with each other and not cut apart.

Figure 13:
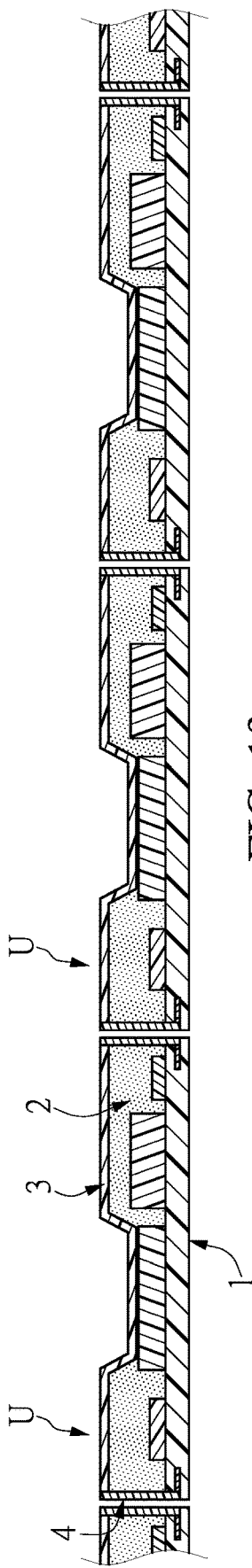
FIG. 13 is a schematic view of another step of the method for manufacturing the package structure according to the second embodiment of the present disclosure.

Referring to FIG. 4 and FIG. 13, in the step S107, the plurality of conductive coating layers 4A' are cut to form a plurality of package structures U. For example, the plurality of package structure U is formed by cutting the plurality of conductive coating layers 4A' along a predetermined line. In addition, the step of cutting the plurality of conductive coating layers 4A' to form a plurality of package structures U further includes cutting the substrate component part 10A to form the plurality of package structures U. With this structure, the plurality of conductive coating layers 4A' are cut to form the plurality of conductive layers 4, the substrate component part 10A is cut to form a plurality of substrates 10, and a plurality of first electronic elements 11 are respectively disposed on the plurality of substrates 10.

Third Embodiment

Figure 14:
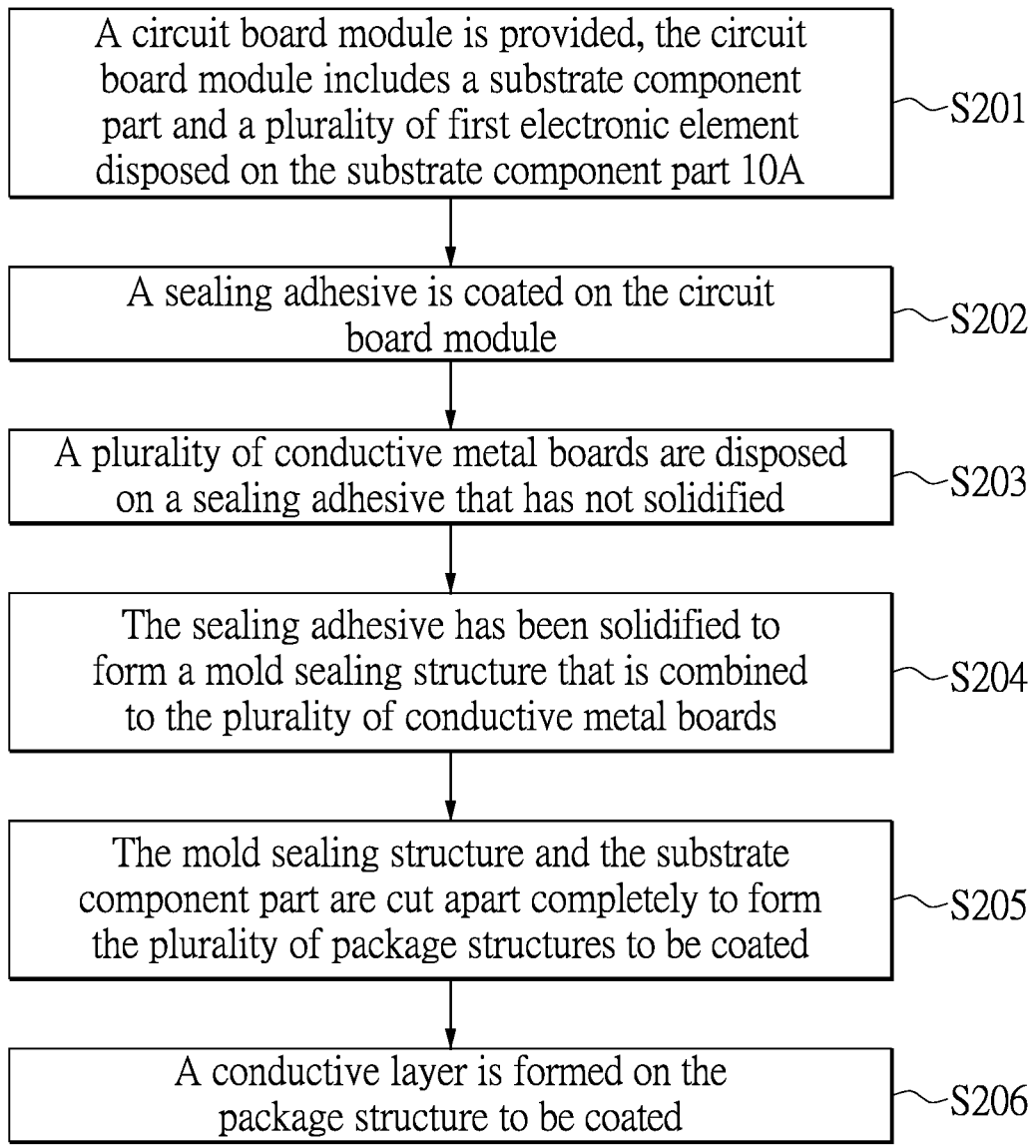
FIG. 14 is a flow chart of a method for manufacturing a package structure according to a third embodiment of the present disclosure.
Figure 15:
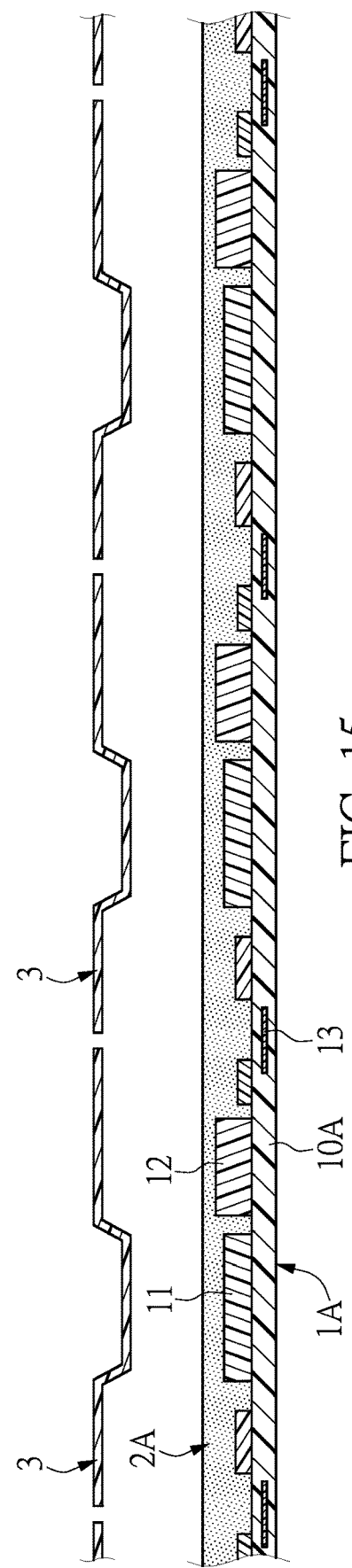
FIG. 15 is a schematic view of a step of the method for manufacturing the package structure according to the third embodiment of the present disclosure.
Figure 16:
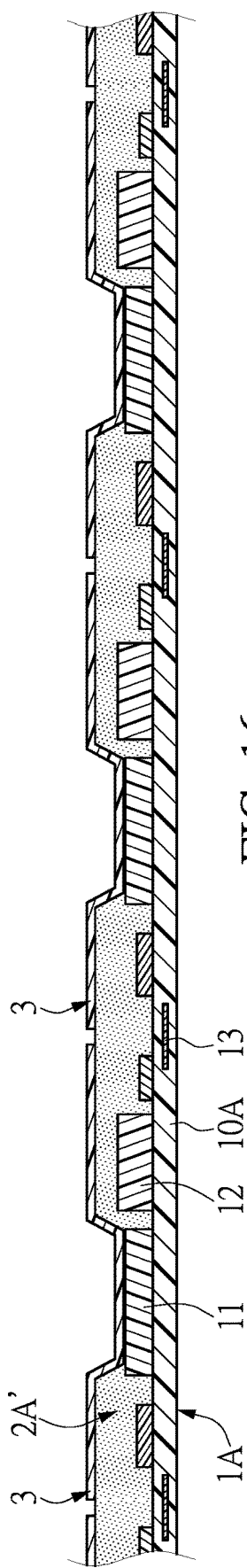
FIG. 16 is a schematic view of another step of the method for manufacturing the package structure according to the third embodiment of the present disclosure.
Figure 17:
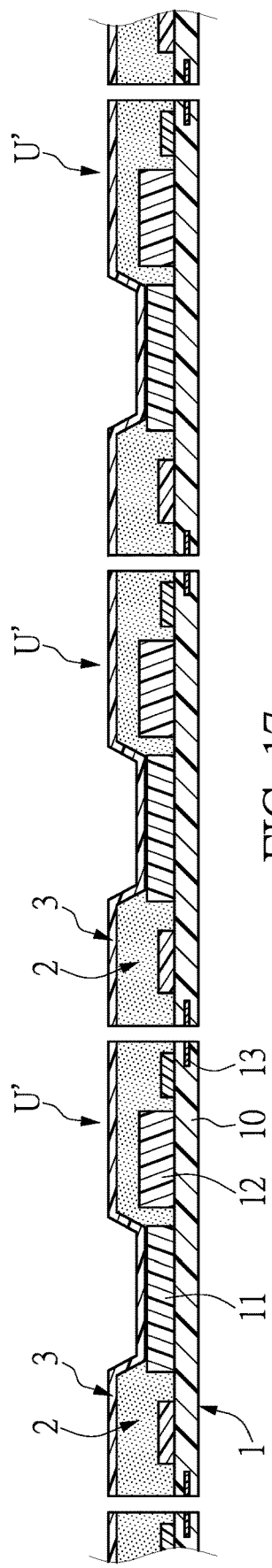
FIG. 17 is a schematic view of another step of the method for manufacturing the package structure according to the third embodiment of the present disclosure.
Figure 18:
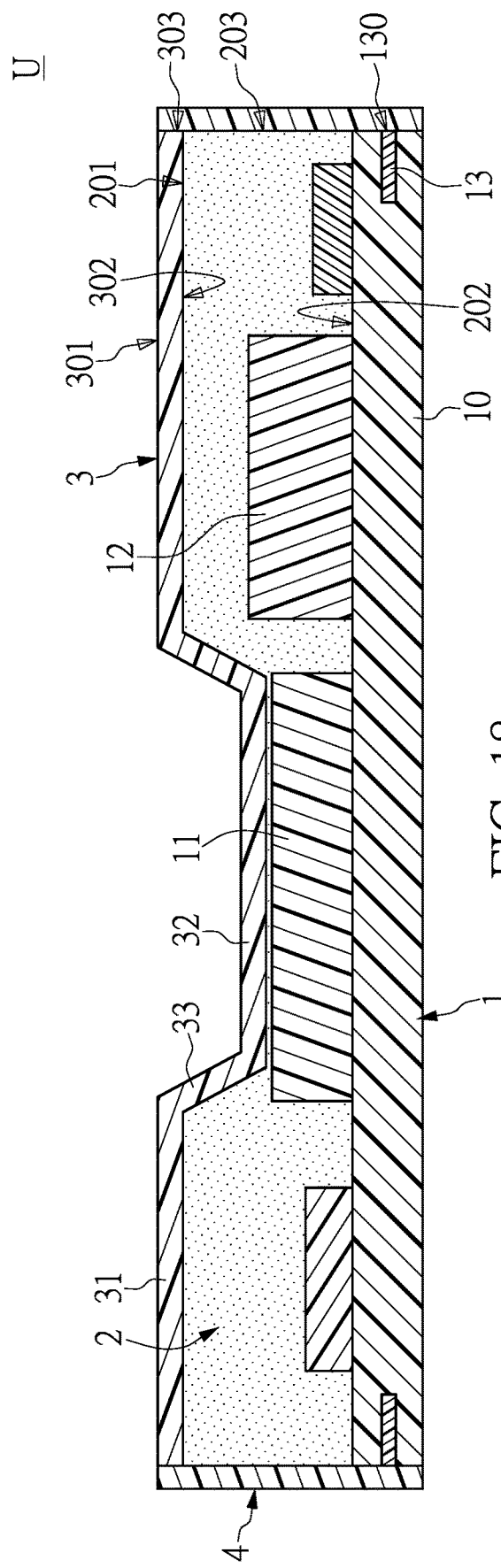
FIG. 18 illustrates a sectional view of an implementation of the package structure according to the third embodiment of the present disclosure.

Referring to FIG. 14 to FIG. 18, FIG. 14 is a flow chart of a method for manufacturing a package structure according to a third embodiment of the present disclosure, FIG. 15 to FIG. 17 are schematic diagrams of steps of the method for manufacturing the package structure according to the third embodiment of the present disclosure, and FIG. 18 illustrates a sectional view of another package structure according to the third embodiment of the present disclosure. It should be noted that characteristics of the elements of the package structure U for the production method provided in the third embodiment are similar to that of the package structure U in the abovementioned embodiments, which is omitted.

Referring to FIG. 6, FIG. 7 and FIG. 14, in the step S201, a circuit board module 1A is provided. The circuit board module 1A includes a substrate component part 10A and a plurality of first electronic element 11 disposed on the substrate component part 10A. In the step S202: coating a sealing compound 2A on the circuit board module 1A. It should be noted that manufacturing processes regarding the step S201 and the step S202 are similar to those of the step S101 and the step S102, and will not be reiterated herein.

Referring to 14 and FIG. 15, in the step S203, disposing a plurality of conductive metal boards 3 on a sealing compound 2A that has not solidified. In the present disclosure, the plurality of conductive metal boards 3 are respectively corresponding to the plurality of first electronic elements 11. In addition, since the conductive metal board 3 is disposed on the sealing compound 2A that has not solidified, the sealing adhesive 2A may be reshaped by the contour of the conductive metal board 3 when the conductive metal board 3 has a concave shape or a convex shape, and a portion of the conductive metal board 3 is disposed more adjacent to the first electronic element 11. In other words, compared with the step S103, the step S203 is to dispose the plurality of conductive metal board 3 on the sealing compound 2A that has not solidified, which improves a fluidity of the sealing compound 2A that has not solidified when the conductive metal board 3 is pressed onto the sealing compound 2A that has not solidified.

Referring to FIG. 14 and FIG. 16, in the step S204, the sealing compound 2A has been solidified to form a mold sealing structure 2A' that is combined to the plurality of conductive metal boards 3. With this structure, the plurality of conductive metal board 3 may be adhered to the mold sealing structure 2A'. That is to say, in the step of solidifying the sealing compound 2A to form the mold sealing structure 2A', the conductive metal board 3 is combined with the mold sealing structure 2A', i.e., the conductive metal board 3 directly contacts and adheres to the mold sealing structure 2A' by bonding. In addition, the method of solidifying the sealing compound 2A in the step S204 is similar to that of the step S104, and will not be reiterated herein.

Referring to FIG. 14 and FIG. 17, in the step S205: cutting the mold sealing structure 2A' and the substrate component part 10A to form a plurality of package structures U' that are about to be coated. For example, in the step of cutting the mold sealing structure 2A' and the substrate component part 10A to form the plurality of package structures U' that are about to be coated, a conductive ground element 13 of the substrate component part 10A may be exposed from two adjacent package structures U' that are about to be coated. In addition, in the step of cutting the mold sealing structure 2A' and the substrate component part 10A to form the plurality of package structures U' that are about to be coated, the mold sealing structure 2A' is divided into a plurality of mold sealing layers 2, and the substrate component part 10A is divided into a plurality of substrates 10. In other words, in the step S205, the mold sealing structure 2A' and the substrate component part 10A are cut apart completely to form the plurality of package structures U' that are about to be coated.

Referring to FIG. 14 and FIG. 18, in the step S206: forming a conductive layer 4 on the package structure U' that is about to be coated. For example, in the step of forming the conductive layer 4 on the package structure U' that is about to be coated, a conductive layer 4A may be coated on the side surface 203 of the package structure U' by spraying or printing, and then the conductive layer 4A is solidified to form the conductive layer 4. In other words, compared with the abovementioned second embodiment, the third embodiment is to coat a plurality of conductive layers 4 on the plurality of package structures U' that are about to be coated, respectively, and the plurality of conductive layers 4 are formed on the side surfaces of the plurality of package structure U' that are about to be coated.

Referring to FIG. 2, as can be seen by comparing FIG. 2 with FIG. 18, in the step S205 of the third embodiment, the mold sealing structure 2A' and the substrate component part 10A are divided into a plurality portions to form the plurality of package structure U' that are separated and about to be coated. Therefore, when disposing the conductive layer 4, the conductive layer 4 can be formed on the side surface 203 of the mold sealing layer 2, the side face 303 of the conductive metal board 3 and the exposed surface 130 of the conductive ground element 13, and the conductive layer 4 can completely cover an outer surface of the substrate 10. That is to say, the present disclosure is to have the conductive layer 4 electrically connected between the conductive metal board 3 and the conductive ground element 13, and the location of the conductive layer is not limited in the present disclosure. In addition, it is worth noting that other structural characteristics of the package structure U in FIG. 18 are similar to those of the package structure U in FIG. 2, and will not be reiterated herein.

Figure 19:
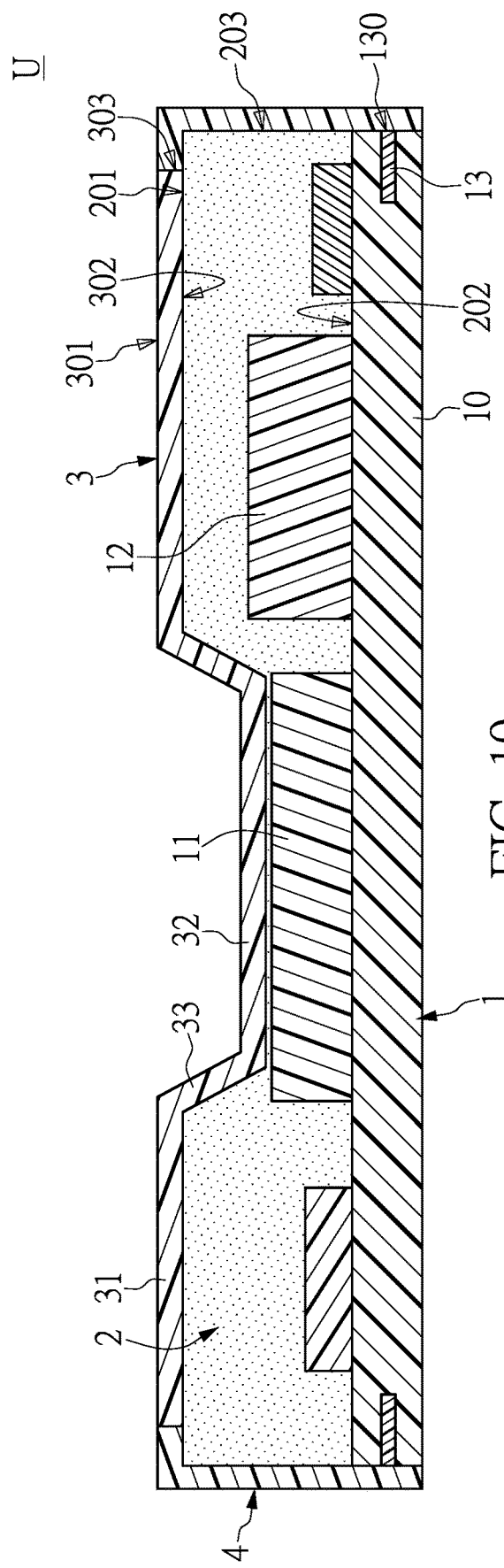
FIG. 19 illustrates a sectional view of another implementation of the package structure according to the third embodiment of the present disclosure.

Referring to FIG. 19, as can be seen by comparing FIG. 19 with FIG. 18, in the implementation of FIG. 18, the conductive layer 4 simultaneously abuts against the side surface 203 of the mold sealing layer 2, the side face 303 of the conductive metal board 3 and the exposed surface 130, thereby the conductive layer 4 is electrically connected to the conductive metal board 3 and the conductive ground element 13. However, in the implementation of FIG. 19, the conductive layer 4 simultaneously abuts against the side surface 203 of the mold sealing layer 2, the top surface 201 of the mold sealing layer 2, the side face 303 of the conductive metal board 3 and the exposed surface 130 of the conductive ground element 13, thereby the conductive layer 4 is electrically connected to the conductive metal board 3 and the conductive ground element 13. In other words, in order to form package structure U in FIG. 19, in the step S205 of cutting the mold sealing structure 2A' and the substrate component part 10A to form the plurality of package structures U' that are about to be coated, a portion of the mold sealing layer 2 may be reserved for exposure without being covered by the conductive metal board 3, namely, a portion of the top surface 201 of the mold sealing layer 2 may be exposed from the conductive metal board 3. With this structure, in the step S206 of forming the conductive layer 4 on the package structure U' that is about to be coated, the conductive layer 4A may be coated on the side surface 203 of the package structure U' that is about to be coated and a portion of the top surface 201 of the mold sealing layer 2 that is exposed from the conductive metal board 3. Finally, the conductive layer 4A is solidified to form the plurality of package structures U.

One of the beneficial effects of the present disclosure is that, by virtue of "the conductive metal board being disposed on the top surface and adjacent to the first electronic element", "the conductive layer being disposed on the side surface and electrically connected to the conductive metal board" and "the conductive metal board and the conductive layer being each an independent component", the package structure U of the present disclosure has the ability of electromagnetic shielding, and the heat dissipation efficiency of the package structure is also improved. In addition, by virtue of "disposing a conductive metal board module on the sealing adhesive that has not solidified" and "forming a conductive coating layer on the plurality of containing grooves, with the conductive coating layer being electrically connected to the conductive ground element and conductive metal board module", the package structure of the present disclosure has the ability of electromagnetic shielding and the heat dissipation efficiency of the package structure is also improved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A package structure, comprising:
a circuit board including a substrate and a first electronic element disposed on the substrate;
a mold sealing layer disposed on the substrate and covering the first electronic element, the mold sealing layer having a top surface, a bottom surface corresponding to the top surface, and a side surface connected between the top surface and the bottom surface;
a conductive metal board disposed on the top surface and adjacent to the first electronic element; and
a conductive layer disposed on the side surface;
wherein the conductive metal board and the conductive layer are each an independent component;
wherein the conductive metal board has a top face, a bottom face corresponding to the top face, and a side face connected between the top face and the bottom face;
wherein the circuit board further includes a conductive ground element embedded into the substrate;
wherein the conductive ground element has an exposed surface for which the substrate is exposed, the conductive layer is bent and directly contacts the side surface, the side face, the top surface, and the exposed surface, and the conductive layer is electrically connected to the conductive metal board and the conductive ground element.

2. A package structure, comprising:
a circuit board including a substrate and a first electronic element disposed on the substrate;
a mold sealing layer disposed on the substrate and covering the first electronic element, the mold sealing layer having a top surface, a bottom surface corresponding to the top surface, and a side surface connected between the top surface and the bottom surface;
a conductive metal board disposed on the top surface and adjacent to the first electronic element; and
a conductive layer disposed on the side surface;
wherein the conductive metal board and the conductive layer are each an independent component;
wherein the conductive metal board has a top face, a bottom face corresponding to the top face, and a side face connected between the top face and the bottom face;
wherein the circuit board further includes a conductive ground element embedded into the substrate;
wherein the conductive ground element has an exposed surface for which the substrate is exposed, the conductive layer directly contacts the side surface, the side face, at least a portion of the top face, and the exposed surface, and the conductive layer is electrically connected to the conductive metal board and the conductive ground element.

* * * * *